United States Patent
Yamamoto et al.

(10) Patent No.: US 7,724,799 B2
(45) Date of Patent: May 25, 2010

(54) VCSEL, OPTICAL DEVICE, LIGHT IRRADIATION DEVICE, DATA PROCESSING DEVICE, LIGHT SOURCE, FREE SPACE OPTICAL COMMUNICATION DEVICE, AND OPTICAL TRANSMISSION SYSTEM

(75) Inventors: Masateru Yamamoto, Kanagawa (JP); Masahiro Yoshikawa, Kanagawa (JP); Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 212 days.

(21) Appl. No.: 12/110,448

(22) Filed: Apr. 28, 2008

(65) Prior Publication Data
US 2008/0279245 A1 Nov. 13, 2008

(30) Foreign Application Priority Data
May 11, 2007 (JP) .............................. 2007-126974

(51) Int. Cl.
*H01S 5/00* (2006.01)
(52) U.S. Cl. ............... 372/50.124; 372/50.11; 372/46.013; 372/46.01; 372/45.01; 372/50.1
(58) Field of Classification Search ............ 372/50.124, 372/50.11, 50.1, 46.013, 46.015, 46.01, 45.01
See application file for complete search history.

(56) References Cited

U.S. PATENT DOCUMENTS

| | | | | |
|---|---|---|---|---|
| 5,719,891 A | * | 2/1998 | Jewell | ................... 372/46.013 |
| 5,729,566 A | * | 3/1998 | Jewell | ........................ 372/96 |
| 2005/0100068 A1 | | 5/2005 | Jikutani et al. | |
| 2006/0007979 A1 | | 1/2006 | Jikutani et al. | |

FOREIGN PATENT DOCUMENTS

| | | |
|---|---|---|
| JP | 2003-158340 | 5/2003 |
| JP | 2003-298186 | 10/2003 |
| JP | 2004-253408 | 9/2004 |
| JP | 2005-44964 | 2/2005 |
| JP | 2005-347388 | 12/2005 |

* cited by examiner

*Primary Examiner*—Minsun Harvey
*Assistant Examiner*—Kinam Park
(74) *Attorney, Agent, or Firm*—Fildes & Outland, P.C.

(57) ABSTRACT

A VCSEL includes a first distributed Bragg reflector (DBR) of a first conductivity type formed on a substrate and including at least one semiconductor layer to be oxidized, an active region having a column shaped structure and formed on the first DBR, and a second DBR of a second conductivity type. At least one hole starting from a surface of the first DBR and reaching the at least one semiconductor layer to be oxidized is formed in the first DBR outside of a column shaped structure of the second DBR. An oxidized region is formed in the semiconductor layer to be oxidized by selectively oxidizing from a side surface of the hole. In the first DBR, a first current path is formed by a conductive region surrounded by the oxidized region, and a second current path is formed by a conductive region not surrounded by the oxidized region.

17 Claims, 9 Drawing Sheets

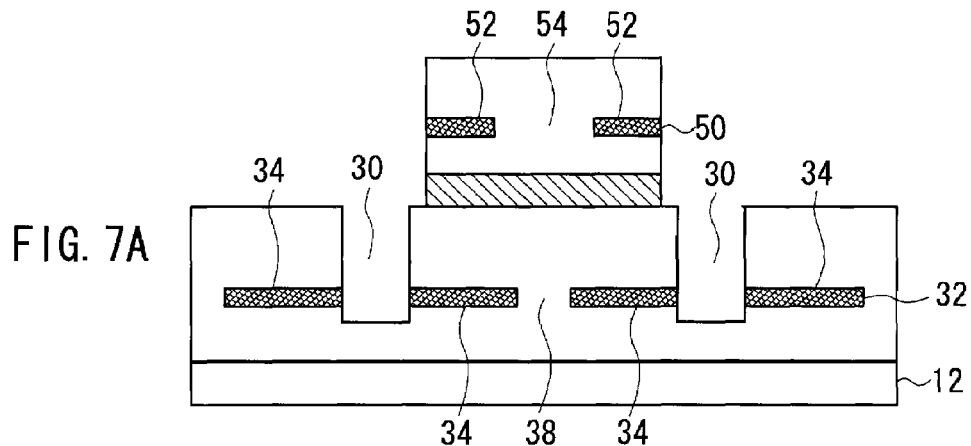
FIG. 7A
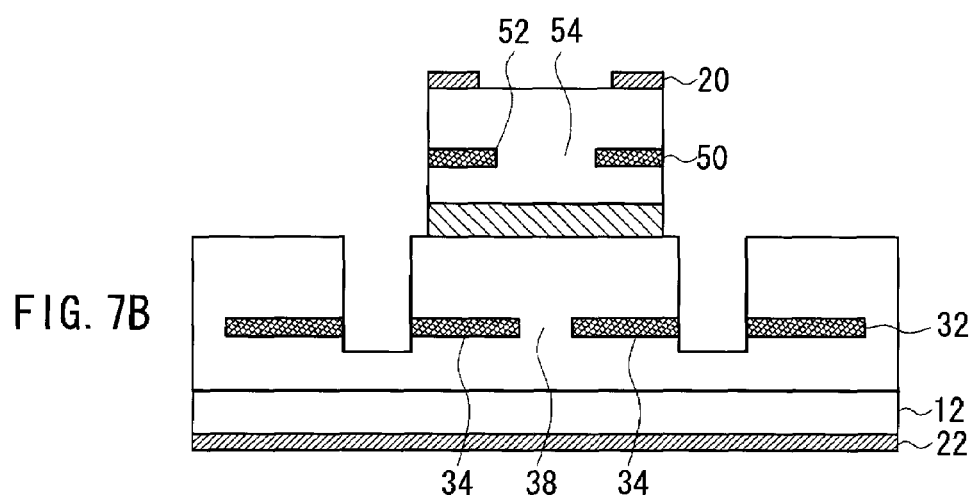
FIG. 7B
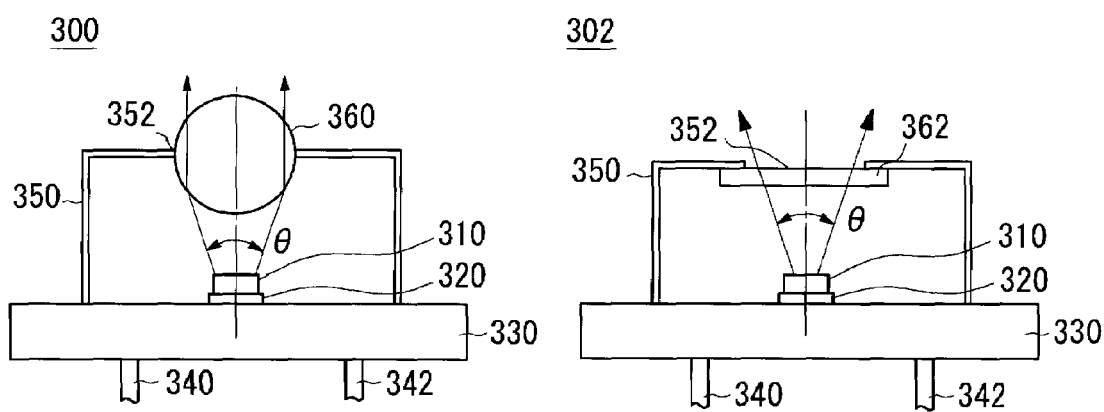
FIG. 8A
FIG. 8B

VCSEL, OPTICAL DEVICE, LIGHT IRRADIATION DEVICE, DATA PROCESSING DEVICE, LIGHT SOURCE, FREE SPACE OPTICAL COMMUNICATION DEVICE, AND OPTICAL TRANSMISSION SYSTEM

CROSS-REFERENCE TO RELATED APPLICATION

This application is based on and claims priority under 35 USC 119 from Japanese Patent Application No. 2007-126974 filed May 11, 2007.

BACKGROUND

1. Technical Field

This invention relates to a Vertical-Cavity Surface-Emitting Laser diode (hereinafter referred to as VCSEL), an optical device, a light irradiation device, a data processing device, a light source, a free space optical communication device, and an optical transmission system.

2. Related Art

As light sources for data communication using an optical fiber or the like or for a data processing device such as a copier, VCSELs have been used, which consume less power and can be easily arranged in two dimensional arrays.

In a VCSEL, a semiconductor layer to be oxidized that includes Al as a constituent element may be selectively oxidized so that current confining and light confining can be concurrently performed. When traverse mode control is performed by such selective oxidation, if the semiconductor layer to be oxidized exists near an active layer, light would be excessively confined, and thus the size of the region to be oxidized should be made equal to or less than about 5 micrometers. As a result, the light output of the VCSEL may be limited, and resulting high resistance may generate heat, which may degrade device property.

In a method proposed to address such disadvantages, the semiconductor layer to be oxidized may be disposed spaced apart from the active layer, and the semiconductor layer to be selectively oxidized may be used as a light confining layer, thereby traverse mode may be controlled.

The present invention aims to provide a VCSEL in which the resistance of a current path may be reduced and traverse mode can be controlled, and provide an optical device, a light irradiation device, a data processing device, a light source, a free space optical communication device and an optical transmission system that uses the VCSEL.

SUMMARY

An aspect of the present invention provides a VCSEL that includes a substrate, a first distributed Bragg reflector of a first conductivity type formed on the substrate, an active region on the first distributed Bragg reflector, and a second distributed Bragg reflector of a second conductivity type. The first distributed Bragg reflector includes at least one semiconductor layer to be oxidized. The active region has a column shaped structure. At least one hole or groove is formed in the first distributed Bragg reflector outside of a column shaped structure of the second distributed Bragg reflector. The groove starts from a surface of the first distributed Bragg reflector and reaches the at least one semiconductor layer to be oxidized. An oxidized region is formed in the semiconductor layer to be oxidized by selectively oxidizing from a side surface of the groove. A first current path and a second current path are formed in the first distributed Bragg reflector. The first current path is formed by a conductive region that is surrounded by the oxidized region. The second current path is formed by a conductive region that is not surrounded by the oxidized region.

BRIEF DESCRIPTION OF THE DRAWINGS

Exemplary embodiments of the present invention will be described in detail based on the following figures, wherein:

FIG. 7A and FIG. 7B are cross sectional views to illustrate a process for fabricating a VCSEL of the second example;

FIG. 8A and FIG. 8B are schematic cross sectional views of a module in which an optical component is mounted on a VCSEL according to an example;

FIG. 8B is used;

FIG. 8B is used for a transmission system;

DETAILED DESCRIPTION

Referring to the accompanying drawings, exemplary embodiments for implementing the present invention will be described.

Figure 1A:
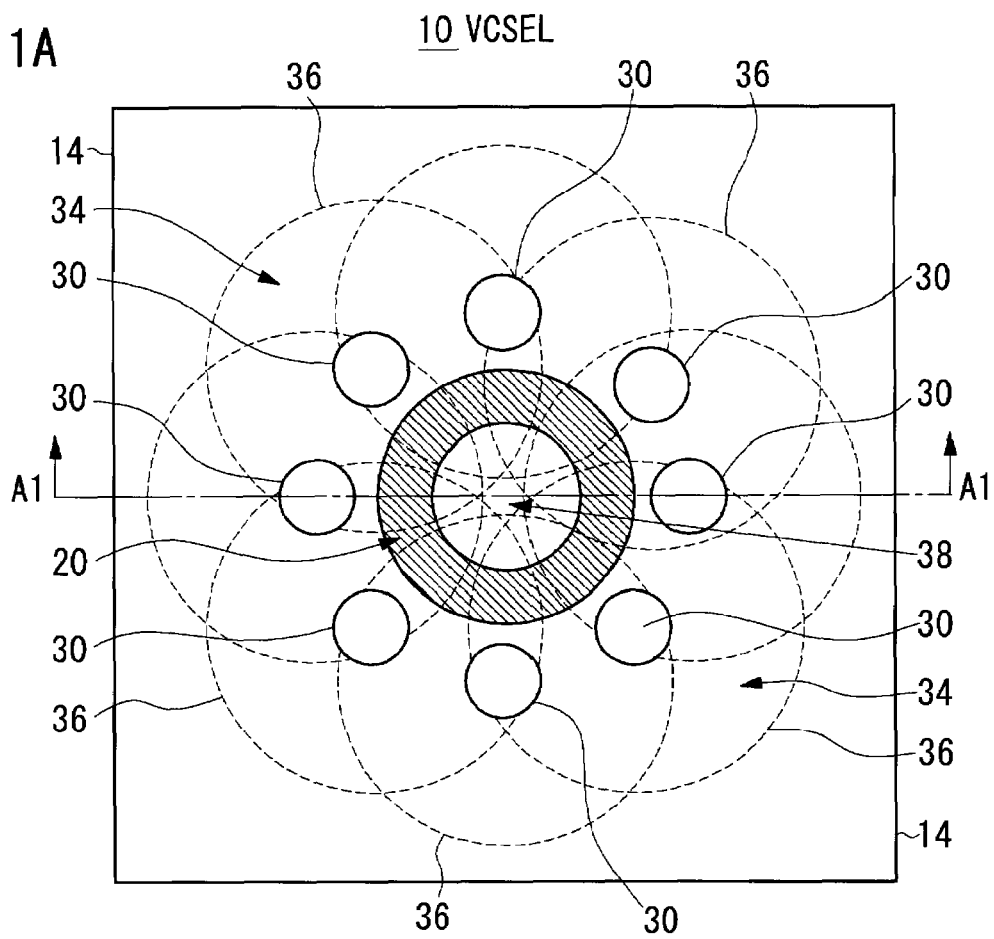
FIG. 1A is a schematic plan view of a VCSEL according to a first example of the present invention.

FIG. 1A is a schematic plan view of a VCSEL according to a first example of the present invention.

Figure 1B:
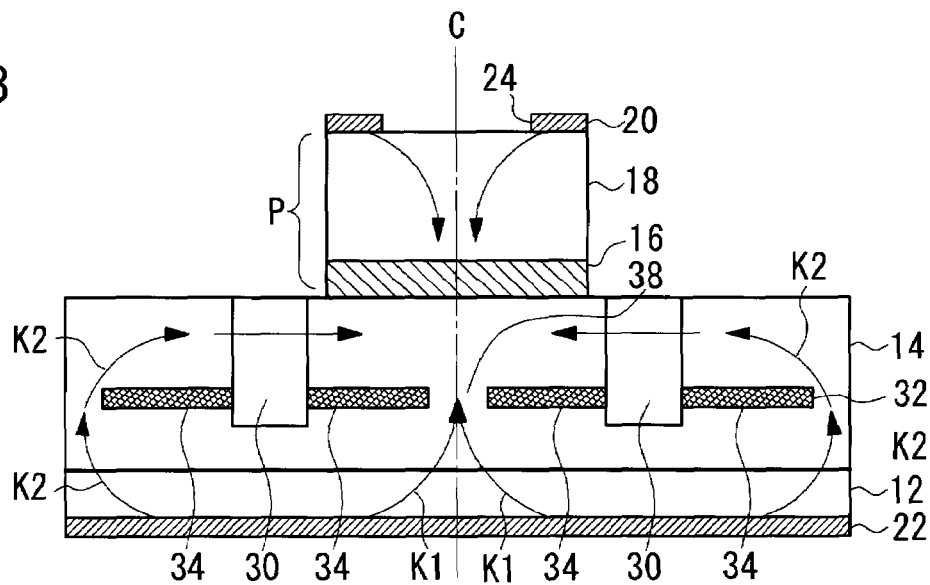
FIG. 1B is a schematic cross sectional view of FIG. 1A taken along line A1-A1.

FIG. 1B is a schematic cross sectional view of FIG. 1A taken along line A1-A1. These drawings are provided merely for illustrating main elements of a VCSEL, and do not necessarily show a complete configuration of a VCSEL.

As shown in FIG. 1A and FIG. 1B, a VCSEL 10 according to the first example includes an n-type substrate 12, an n-type Distributed Bragg Reflector (hereinafter referred to as DBR) 14 formed on the substrate 12, an active region 16 formed on the lower DBR 14, a p-type upper DBR 18 formed on the active region 16, an annular upper electrode 20 formed on the upper DBR 18, and a lower electrode 22 formed on the back surface of the substrate 12. In FIG. 1A, the upper electrode 20 is indicated by a hatch pattern.

The substrate 12 is preferably made of a semiconductor substrate such as GaAs. On the semiconductor substrate, the lower DBR 14, the active region 16, and the upper DBR 18 may be formed by stacking plural semiconductor layers by epitaxial growth.

Preferably, the lower DBR 14 and the upper DBR 18 are formed by stacking plural pairs of AlGaAs semiconductor layers, each having a different Al-composition. The thickness of each layer is ¼λ (where λ is oscillation wavelength). In addition, the upper DBR 18 and the active region 16 may be shaped into a cylindrical post P by etching the semiconductor layers.

In the VCSEL 10, the lower DBR 14 and the upper DBR 18 may form a vertical resonator. When current is injected from the upper electrode 20 and the lower electrode 22, light is generated in the active region 16. The light is amplified by the vertical resonator, and emitted as laser light from a round-shaped opening 24 in a center portion of the upper electrode 20.

In a typical VCSEL of a related art, an oxidized region is formed in a post by a selective oxidation, and a selectively oxidized region performs current confining and light confining. In contrast, in the VCSEL 10 of an example of the invention, an oxidized region that performs light confining is not formed in the post P, but formed in the lower DBR 14.

Plural round-shaped holes or grooves 30 are formed at positions that are rotationally symmetric with respect to the central axis of the post P. More specifically, as shown in FIG. 1A, holes 30 are disposed at a same distance from a central axis C, at regular angular intervals such as 45 degrees. The lower DBR 14 includes a semiconductor layer to be oxidized 32 to form an oxidized region for confining light. For example, when the lower DBR 14 includes a pair of an n-type $Al_xGa_{1-x}As$ layer and an $Al_yGa_{1-y}As$ layer (X>Y), the semiconductor layer to be oxidized 32 may be an n-type AlAs layer or $Al_xGa_{1-z}As$ layer (Z>X) The $Al_zGa_{1-z}As$ layer may substitute for $Al_xGa_{1-x}As$ layer. Each of the eight holes 30 has a depth starting from a surface of the lower DBR 14 to the semiconductor layer to be oxidized 32 or to slightly beyond the layer 32.

The semiconductor layer to be oxidized 32 has a side surface being exposed by the hole 30. The layer 32 is oxidized from the side surface to a predetermined distance. When the hole 30 has a round shape in cross section, the oxidation of the semiconductor layer to be oxidized 32 may isotropically propagate in a radial direction centering the hole 30. The position at which the oxidation stops may be determined by controlling the time period of the oxidation. As shown in FIG. 1A, a boundary 36 of an oxidized region 34 that is propagated from the side surface of one of the holes 30 becomes approximately concentric with the hole 30. The oxidized region 34 and another oxidized region 34 of an adjacent another hole 30 may overlap in portions each other. By controlling the boundaries 36 of the oxidized regions 34, a non-oxidized region 38 that is surrounded by the oxidized regions 34 can be formed. The oxidized region 34 is an area that is electrically insulated, while the non-oxidized region 38 is an area that is electrically conductive.

The outline of the non-oxidized region 38 shown in FIG. 1A is an approximate polygonal shape defined by eight boundaries 36. An approximate center of the non-oxidized region 38 may coincide with the central axis C of the post P. The size of the non-oxidized region 38 may be selected as appropriate in accordance with the traverse mode it controls and with the distance from the active region 16. The farther the semiconductor layer to be oxidized 32 is located from the active region 16, the larger the non-oxidized region 38 may be made. Preferably, the size of the non-oxidized region 38 is made equal to or greater than 5 micrometers in order to control a fundamental traverse mode. The size of equal to or greater than 5 micrometers may prevent reduction in light output and reduce resistance.

To drive the VCSEL 10 shown in FIG. 1A and FIG. 1B, voltage may be applied to the upper electrode 20 and the lower electrode 22 such that the lower DBR 14 and the upper DBR 18 are forward biased. In other words, holes are injected from the upper electrode 20, and electrons are injected from the lower electrode 22. At this time, a path K1 that passes through the non-oxidized region (conductive region) 38 surrounded by the oxidized region 34, and another path that is not surrounded by the oxidized region 34, i.e., a path K2 that passes outside of the non-active region 38 are formed as current paths from the lower electrode 22 to the active region 16. As a result, the device resistance of the VCSEL 10 of this example can be reduced a greater degree than that of a related art in which a non-oxidized region is formed in a post P.

As described above, according to the first example, the semiconductor layer to be oxidized 32 that becomes a light confining layer is not formed in the post P, but formed in the lower DBR 14 that is below the active region 16, and the semiconductor layer to be oxidized 32 is oxidized from the side surface of the hole 30 formed in the lower DBR 14. As a result, two paths are formed in the lower DBR 14 as the current paths to the active region 16; the path K1 in the non-oxidized region 38 that becomes the light mode control layer, and the path K2 that routes around the oxidized region 34. This configuration can reduce the device resistance, and thus inhibit the reduction in light output and the property degradation caused by heat generation due to the resistance.

Figure 2A:
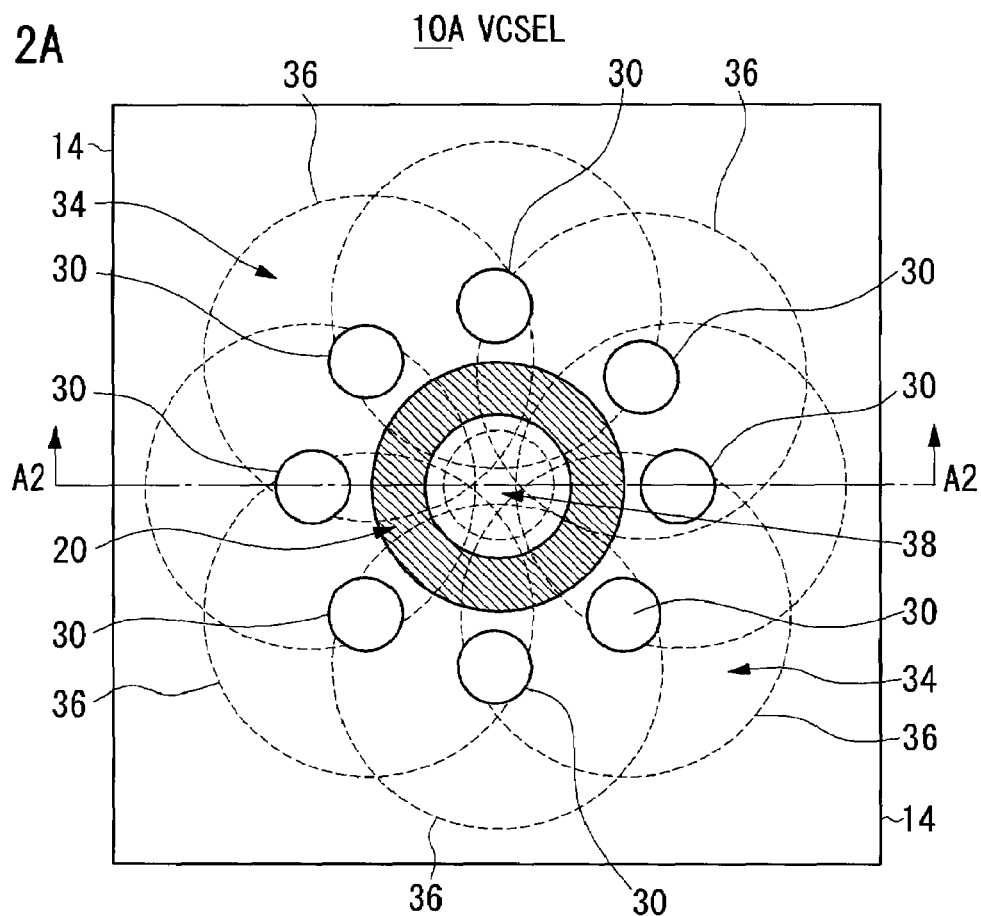
FIG. 2A is a schematic plan view of a VCSEL according to a second example of the present invention.
Figure 2B:
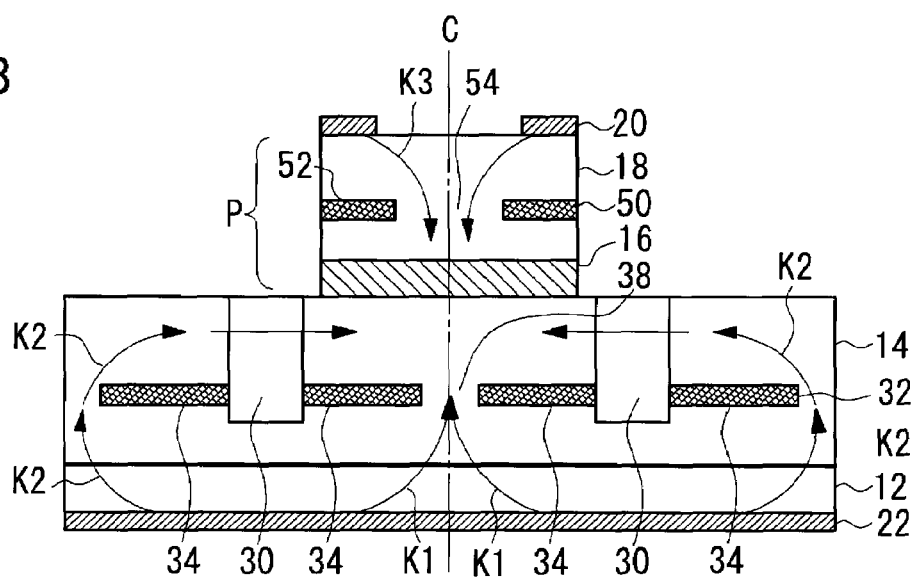
FIG. 2B is a schematic cross sectional view of FIG. 2A taken along line A2-A2.

A second example of the present invention will be now described. FIG. 2A is a schematic plan view of a VCSEL according to a second example. FIG. 2B is a schematic cross sectional view of FIG. 2A taken along line A2-A2. A VCSEL 10A according to the second example includes a current confining layer 50 in the upper DBR 18, in other words, in the post P. Other arrangement is same as in the first example.

The current confining layer 50 may be made any of a semiconductor layer to be oxidized by selective oxidation, an insulating layer by ion implantation, or a buried semiconductor layer, or the like. As an example, a semiconductor layer to be oxidized is used herein for the current confining layer 50. When the upper DBR 18 is a p-type AlGaAs layer, a portion thereof may be changed into a p-type AlAs layer or an AlGaAs layer having a higher the Al-composition. The speed of oxidization is proportional to the Al-composition. The greater the Al-composition is, the higher the speed of oxidization or the greater the oxidizing distance becomes.

After the post P is formed on the substrate, the current confining layer 50 is oxidized for a predetermined time period from the side surface of the post P. By this oxidation, an oxidized region 52 and a non-oxidized region 54 surrounded by the oxidized region 52 are formed in the current confining layer 50. The oxidation of the current confining layer 50 propagates approximately isotropically from the side surface of the post P inward, and thus the non-oxidized region 54 becomes a round shape that reflects the outline of the post P. Preferably, the center portion of the non-oxidized region 54 approximately coincides with the central axis C of the post P, and approximately coincides with the center portion of the non-oxidized region 38 in the lower DBR 14. The oxidized region 52 is electrically insulating, and the non-oxidized region 54 is electrically conductive; and thus a current path that confines the current that is injected from the upper electrode 20 is formed.

According to the second example, when the VCSEL 10A is driven, a current path K3 from the upper electrode 20 to the active region 16 is narrowed such that the current passes through the non-oxidized region 54 in the current confining layer 50. Therefore, the recombination efficiency of hole-electron pairs in the active region 16 may increase, and thus light emission efficiency can be improved.

When the current confining layers are to be formed by oxidation, non-oxidized regions 38 and 54 that are different in size can be formed simultaneously by making the oxidation speed of the current confining layer 50 slower than that of the semiconductor layer to be oxidized 32, and by concurrently oxidizing the current confining layer 32 and the semiconductor layer to be oxidized 50. More specifically, the Al-composition or the thickness of the current confining layer 50 may be made smaller than the Al-composition or the thickness of the semiconductor layer to be oxidized 32. For example, when the Al-composition of the semiconductor layer to be oxidized 32 is 100% and the thickness thereof is 30 nm, the current confining layer 50 may have an Al-composition in a range of 97% to 99% and the thickness of 30 nm or the Al-composition of 100% and a thickness in a range of 10 to 29 nm. To increase the oxidation speed of the current confining layer 50 than that of the semiconductor layer to be oxidized 32, the Al-composition or the thickness of the current confining layer 50 may be made greater than the Al-composition or the thickness of the semiconductor layer to be oxidized 32. For example, when the semiconductor layer to be oxidized 32 has the Al-composition of 98% and the thickness of 30 nm, the current confining layer 50 may have an Al-composition in a range of 99% to 100% and the thickness of 30 nm, or the Al-composition of 98% and a thickness of greater than 30 nm.

The current confining layer 50 may be disposed in close proximity to or 1 to 3 pairs apart from the active region in the upper DBR, in order to perform current confining. In contrast, the semiconductor layer to be oxidized 32 is not a current confining layer. In order to reduce the resistance in the current path through the conductive region that is not surrounded by the oxidized region, the layer 32 is disposed in the lower DBR that is spaced farther from the active region than the current confining layer 50 is. For example, the layer 32 may be disposed at a position that is 3 to 15 pairs spaced apart from the active region.

When the current confining layer is to be formed by ion implantation, for example, a mask is formed at a top portion of the post P excepting the portion the oxidized region 52 described above is to be formed, and protons are injected at a constant energy from the top portion of the post P, thereby an insulating area that acts as the oxidized region 52 can be formed. In a case where the current confining layer is to be formed from a semiconductor buried layer, for example, an n-type semiconductor layer is formed in an area that corresponds to the oxidized region 52 such that the layer is reverse biased when the VCSEL is driven.

Figure 3A:
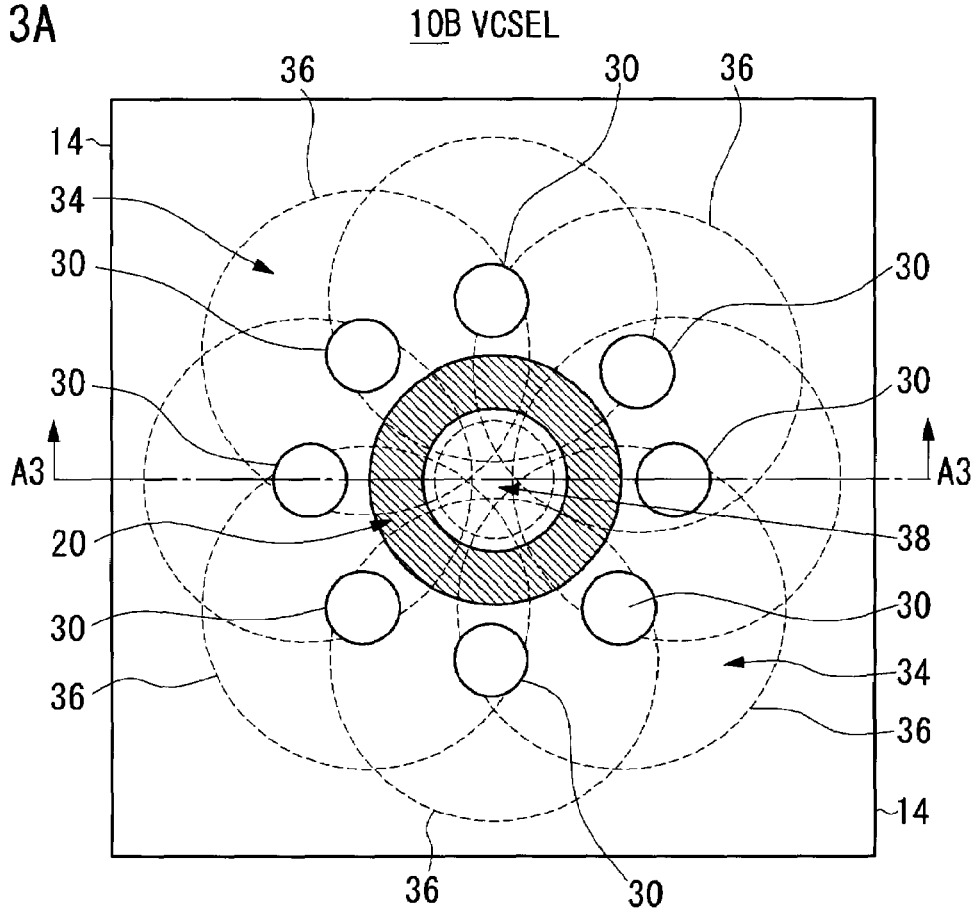
FIG. 3A is a schematic plan view of a VCSEL according to a third example of the present invention.
Figure 3B:
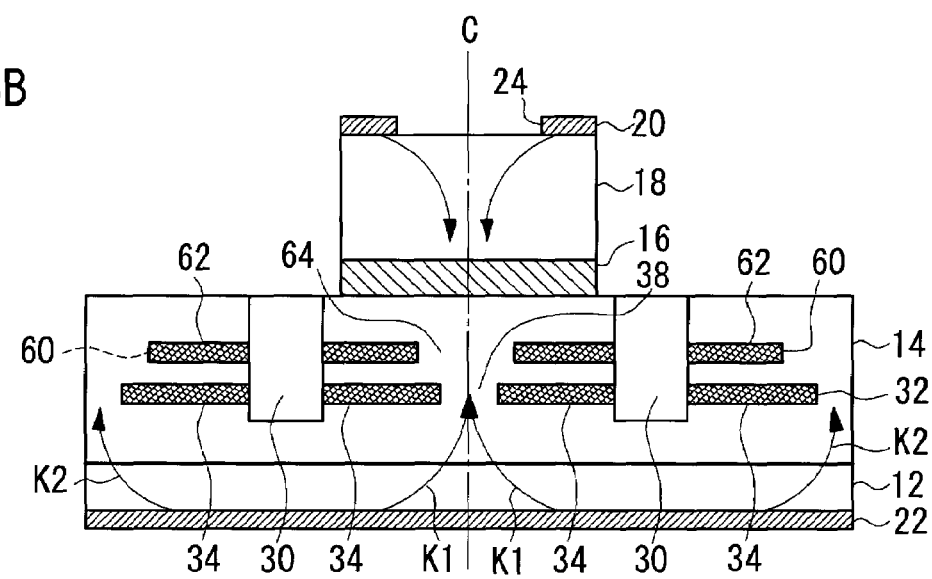
FIG. 3B is a schematic cross sectional view of FIG. 3A taken along line A3-A3.

A third example of the present invention will be now described. FIG. 3A is a schematic plan view of a VCSEL according to a third example. FIG. 3B is a schematic cross sectional view of FIG. 3A taken along line A3-A3. A VCSEL 10B according to the third example includes plural semiconductor layers to be oxidized in the lower DBR 14. Other arrangement is same as in the first example.

The lower DBR 14 includes the semiconductor layer to be oxidized 32 shown in the first example, and another semiconductor layer to be oxidized 60. The hole 30 formed in the lower DBR 14 has a depth that passes through the semiconductor layers to be oxidized 60 and 32. By oxidizing the semiconductor layers to be oxidized 60 and 32 from the side surface the hole 30 similarly to the first example, the oxidized region 34 and the non-oxidized region 38 surrounded by the oxidized region 34 are formed in the semiconductor layer to be oxidized 32, and an oxidized region 62 and a non-oxidized region 64 surrounded by the oxidized region 62 are formed in the semiconductor layer to be oxidized 60. Preferably, the non-oxidized region 64 surrounded by the oxidized region 62 of the semiconductor layer to be oxidized 60 that is nearer the active region 16 has a larger area than the area of the non-oxidized region 38 of the semiconductor layer to be oxidized 32. By broadening the light confining area that is nearer the active region 16, light-collecting efficiency may be improved and traverse mode can be easily controlled.

When the lower DBR 14 is an n-type AlGaAs layer, the semiconductor layer to be oxidized 60 may be formed, for example, by changing a portion of the AlGaAs layer into an n-type AlAs layer or an AlGaAs layer having a higher Al-composition. In order to make the oxidation speed of the semiconductor layer to be oxidized 60 slower than that of the semiconductor layer to be oxidized 32, the thickness of the semiconductor layer to be oxidized 60 may be made thinner than that of the semiconductor layer to be oxidized 32. For example, the thickness of the layer 60 may be a thickness that is 5 nm thinner than that of the semiconductor layer to be oxidized 32. By concurrently oxidizing the semiconductor layers to be oxidized 32 and 60 each having a different thickness as described above, non-oxidized regions 38 and 64 that are different in size can be formed simultaneously.

The method for making difference in oxidation speeds of the semiconductor layer to be oxidized 32 and the semiconductor layer to be oxidized 60 is not limited to making difference in thickness as described above. Alternatively, the Al-composition of the layers may be made different values. In addition, in order to sustain a function of the lower DBR 14 as a reflective mirror, at least one AlGaAs layer having a lower Al-composition may be interposed between the semiconductor layer to be oxidized 60 and the semiconductor layer to be oxidized 32.

Figure 4A:
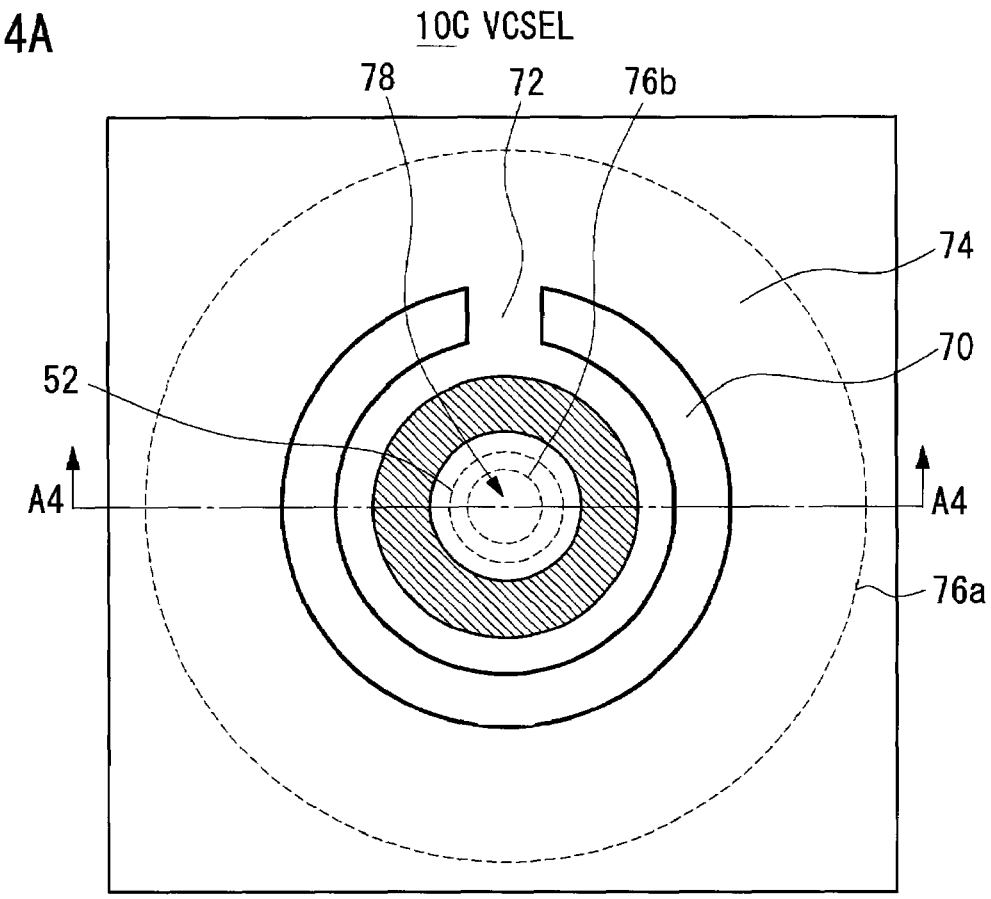
FIG. 4A is a schematic plan view of a VCSEL according to a fourth example of the present invention.
Figure 4B:
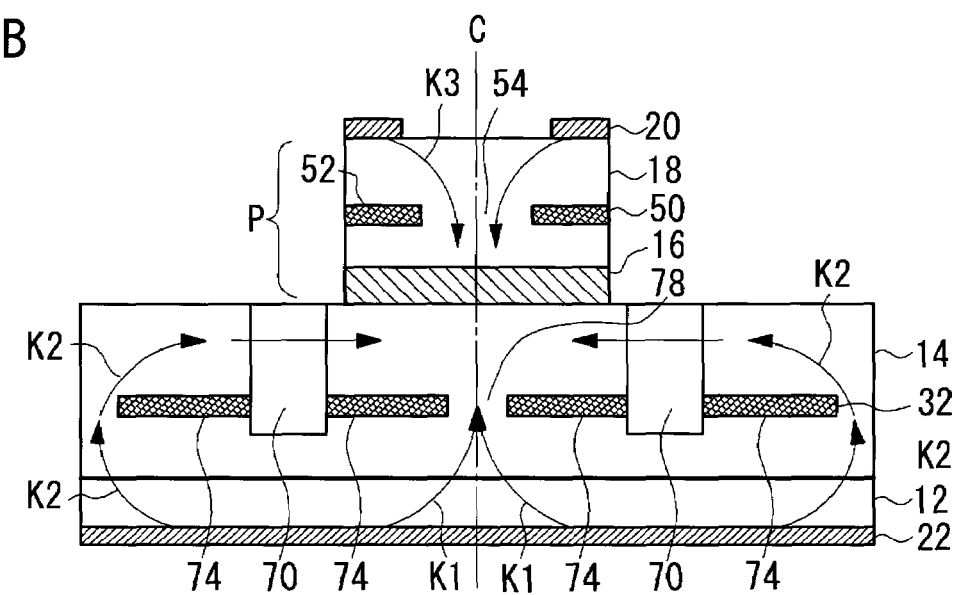
FIG. 4B is a schematic cross sectional view of FIG. 4A taken along line A4-A4.

A fourth example of the present invention will be now described. FIG. 4A is a schematic plan view of a VCSEL according to a fourth example. FIG. 4B is a schematic cross sectional view of FIG. 4A taken along line A4-A4. A VCSEL 10C according to the fourth example includes a single hole or groove, instead of plural holes 30 (see FIG. 2) that are used in the second example. Other arrangement is same as in the second example.

As shown in FIG. 4A, an arc-shaped groove 70 that is concentric with the central axis C of the post P may be formed in the lower DBR 14. The groove or hole 70 shown in FIG. 4A is a discontinuous arc shape divided by a discontinuous portion 72; however, the groove may include another discontinuous portion in addition to the discontinuous portion 72. The groove 70 may have a depth that reaches the semiconductor layer to be oxidized 32 in the lower DBR 14. The semiconductor layer to be oxidized 32 may be oxidized from the side surface that is exposed by the groove 70. The oxidation of the semiconductor layer to be oxidized 32 propagates isotropically, and thus an oxidized region 74 may be formed in an area that is surrounded by an outer arc-shaped boundary 76a and an inner arc-shaped boundary 76b. By this oxidization, the discontinuous portion 72 of the groove 70 may also be oxidized.

The inner arc-shaped boundary 76b defines the outline of a non-oxidized region 78. Preferably, the center portion of the non-oxidized region 78 coincides with the central axis C of the post P, and coincides with the center portion of the non-oxidized region of the current confining layer 50 in the post P. According to the fourth example, the oxidized region 74 is formed in the semiconductor layer to be oxidized 32 by the single groove 70, instead of by plural holes. Therefore, the oxidized region 74 can be easily controlled, and the accuracy in the size of the non-oxidized region 78 can be improved.

Figure 5A:
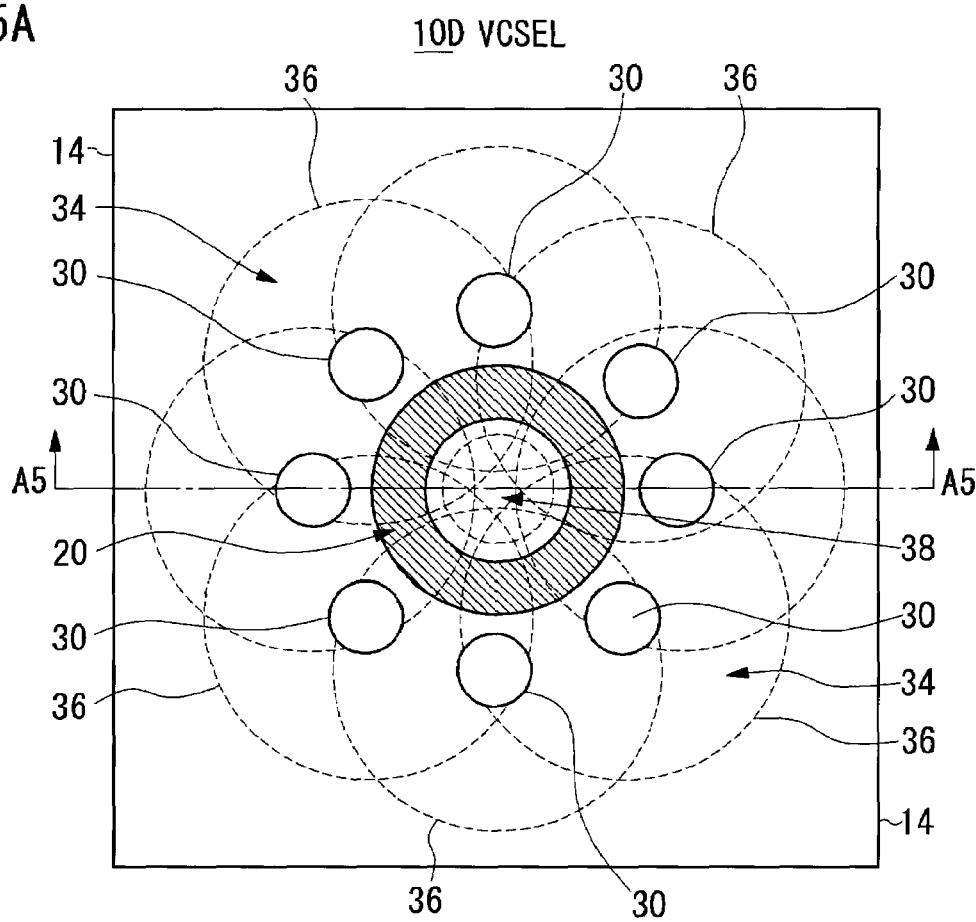
FIG. 5A is a schematic plan view of a VCSEL according to a fifth example of the present invention.
Figure 5B:
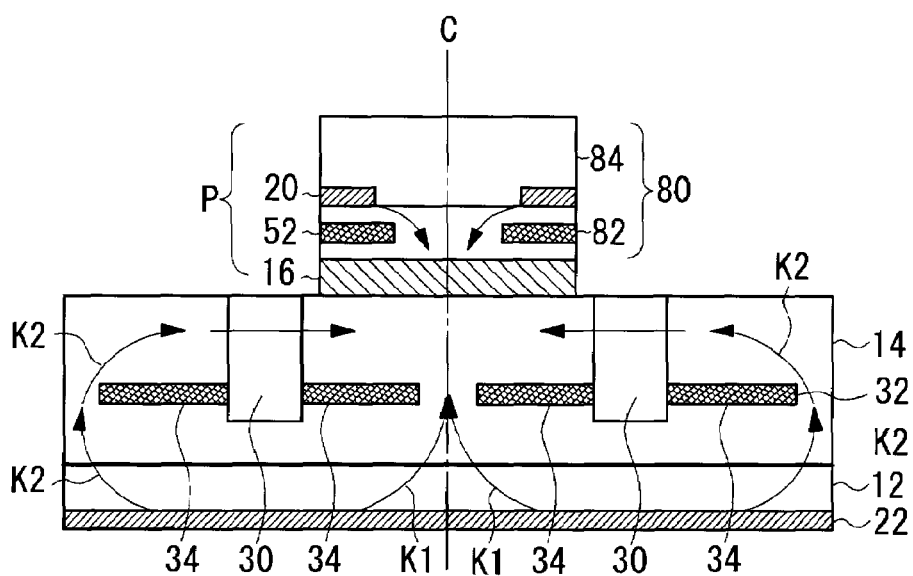
FIG. 5B is a schematic cross sectional view of FIG. 5A taken along line A5-A5.

A fifth example of the present invention will be now described. FIG. 5A is a schematic plan view of a VCSEL according to a fifth example. FIG. 5B is a schematic cross sectional view of FIG. 5A taken along line A5-A5. In a VCSEL 10D according to the fifth example, the upper DBR is modified from that used in the second example. Other arrangement is same as in the second example.

The VCSEL 10D according to the fifth example includes an upper DBR 80. The upper DBR 80 includes a semiconductor DBR 82 in which the DBR is formed of p-type semiconductor layers, and a dielectric DBR 84 in which the DBR is formed of dielectric layers stacked on the semiconductor DBR 82. The semiconductor DBR 82 may include the current confining layer 50 similarly to the case in the second example. On a surface of the current confining layer 50, the upper electrode 20 may be formed. Current may be injected from the upper electrode 20 into the semiconductor DBR 82.

The dielectric DBR 84 may be made of, for example, dielectric layers of TiO2 and SiO2, or non-doped AlGaAs layers each having a different Al-composition. The combination of the semiconductor DBR 82 and the dielectric DBR 84 in the upper DBR 80 may form a resonator on an upper side. In this case, the upper electrode 20 acts as an internal electrode in the post P. According to the fifth example, the number of the layers of the semiconductor layers to be epitaxially grown on the substrate can be reduced, and thus a lower cost VCSEL can be provided.

In the first to the fifth examples, a single-spot type VCSEL that has a single post P on a substrate has been described. Alternatively, the VCSEL may be a multi-beam or multi-spot typed VCSEL in which plural posts P are formed on a substrate and laser light is emitted from each of the plural post structures P. In addition, in the examples described above, a VCSEL in which an AlGaAs system semiconductor layer is used has been described; however, the present invention can be applicable also to a VCSEL in which other III-V group compound semiconductor is used. The shape of the post structure is not limited to the cylindrical shape, but may be a rectangular shape. The shape or number of the hole or groove formed in the lower DBR may also be changed as appropriate.

Figure 6A:
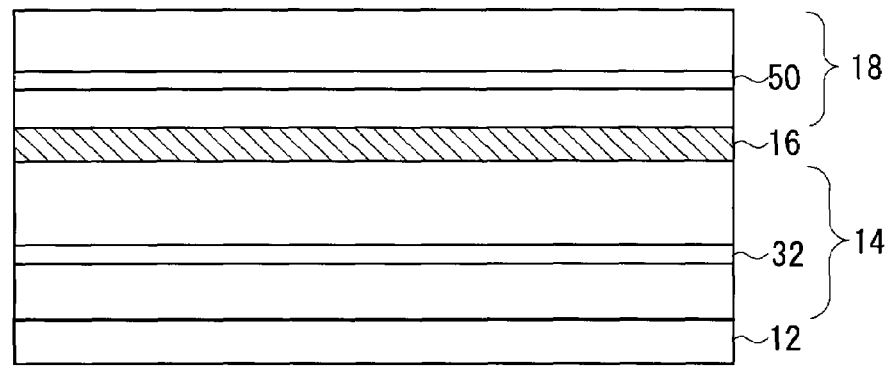
FIGS. 6A to 6C are cross sectional views to illustrate a process for fabricating a VCSEL of the second example.

Referring to FIGS. 6A to 6C and FIGS. 7A and 7B, a method for fabricating a VCSEL according to the second example of the present invention will be now described. As shown in FIG. 6A, sequentially stacked on the n-type GaAs substrate 12 by Metal Organic Chemical Vapor Deposition (MOCVD) are: the n-type lower DBR 14 having a carrier concentration of $1 \times 10^{18}$ cm$^{-3}$ in which 40.5 periods of $Al_{0.9}Ga_{0.1}As$ and $Al_{0.15}Ga_{0.85}As$, each having a thickness of ¼ of the wavelength in the medium, are alternately stacked; the active region 16 having a thickness of the wavelength in the medium and made of an undoped lower $Al_{0.6}Ga_{0.4}As$ spacer layer, an undoped quantum well active layer (thickness of 70 nm, made of three GaAs quantum well layers and the thickness of 50 nm, four $Al_{0.3}Ga_{0.7}As$ barrier layers), and an undoped upper $Al_{0.6}Ga_{0.4}As$ spacer layer; and the p-type upper DBR 18 having a carrier concentration of $1 \times 10^{18}$ cm$^{-3}$ in which 30 periods of $Al_{0.9}Ga_{0.85}As$ and $Al_{0.15}Ga_{0.85}As$, each having a thickness of ¼ of the wavelength in the medium, are alternately stacked.

In the lower DBR 14, the semiconductor layer to be oxidized 32 made of an n-type AlAs may be formed as a traverse mode control layer for confining light. In the upper DBR 18, the current confining layer 50 made of a p-type AlAs may be formed. Between the substrate 12 and the lower DBR 14, an n-type GaAs buffer layer having a carrier concentration of $1 \times 10^{18}$ cm$^{-3}$ may be formed. In the uppermost layer of the upper DBR 18, a p-type GaAs contact layer having a carrier concentration of $1 \times 10^{19}$ cm and a thickness of about 20 nm may be formed.

Figure 6B:
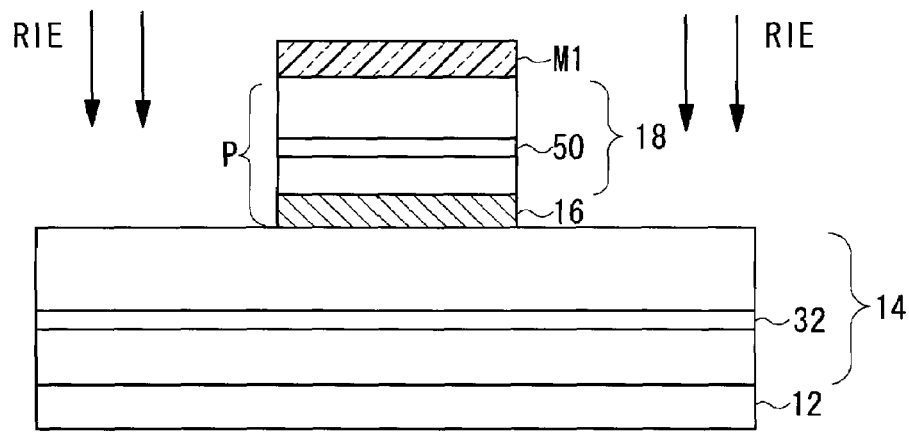

As shown in FIG. 6B, a mask M1 is formed on the upper DBR 18 by a photolithography process. Then, a reactive ion etching is performed to the surface of the lower DBR 14 to form the cylindrical post P on the lower DBR 14. The etching does not necessarily stop at the surface of the lower DBR 14, but a portion of the lower DBR 14 may also be etched away.

Figure 6C:
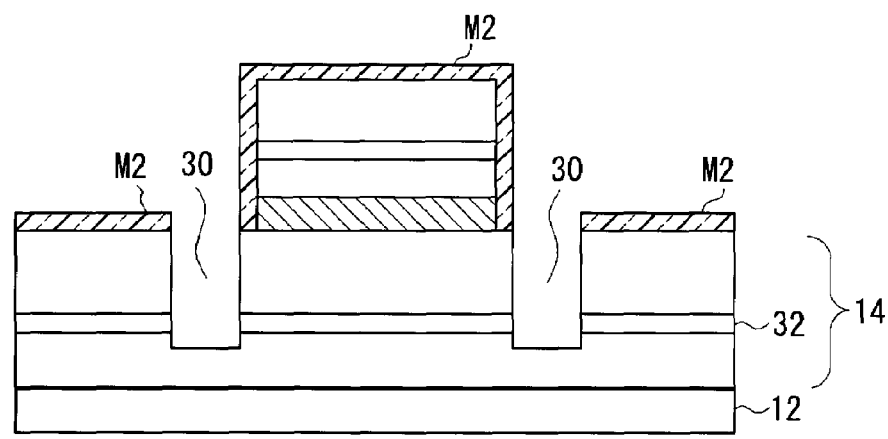

As shown in FIG. 6C, a mask M2 is formed to cover the lower DBR 14 and the surface of the post, excepting the portion where the holes 30 are to be formed. In the mask M2, openings that correspond to the holes 30 to be formed in the lower DBR 14 are formed. By performing a reactive ion etching using the mask M2, plural holes 30 are formed in the lower DBR 14. By the etching, the semiconductor layer to be oxidized 32 in the lower DBR 14 is exposed by the holes 30.

After removing the mask M2, the substrate is oxidized as shown in FIG. 7A. The current confining layer 50 in the post P is oxidized from the side surface of the post P. In addition, the semiconductor layer to be oxidized 32 in the lower DBR 14 is oxidized from the side surface of the hole 30. By the oxidation, the non-oxidized region 54 surrounded by the oxidized region 52 in the current confining layer 50 is formed in the post P. In the lower DBR 14, the non-oxidized region 38 surrounded by the oxidized region 34 in the semiconductor layer to be oxidized 32 is formed.

Preferably, the oxidation speed of the current confining layer 50 is slower than the oxidation speed of the semiconductor layer to be oxidized 32. For this purpose, the thickness of the current confining layer 50 may be made thinner than that of the semiconductor layer to be oxidized 32, or the Al-composition of the current confining layer 50 may be made smaller than the Al-composition of the semiconductor layer to be oxidized 32. In the latter case, the current confining layer may be an AlGaAs layer, not an AlAs layer.

As shown in FIG. 7B, the upper electrode 20 made of Au is formed at a top portion of the post P. On the back surface of the substrate, the lower electrode 22 made of Au/Ge is formed.

Referring to the accompanying drawings, an optical device (module), a light irradiation device, a light source, a transmission system, an optical transmission device, or the like will be now described. FIG. 8A is a cross sectional view illustrating a configuration of an optical device in which a VCSEL is mounted. In an optical device 300, a chip 310 in which a VCSEL is formed is fixed on a disc-shaped metal stem 330 through a conductive adhesive 320. Conductive leads 340 and 342 are inserted into through holes (not shown) formed in the stem 330. One lead 340 is electrically coupled to an n-side electrode of the VCSEL, and the other lead 342 is electrically coupled to a p-side electrode.

Above the stem 330 that includes the chip 310, a rectangular hollow cap 350 is fixed, and a ball lens 360 is fixed in an opening in a center portion of the cap 350. The optical axis of the ball lens 360 is positioned to match an approximate center of the chip 310. When a forward voltage is applied between the leads 340 and 342, laser light is emitted perpendicularly from the chip 310. The distance between the chip 310 and the ball lens 360 may be adjusted such that the ball lens 360 is contained within the divergence angle θ of the laser light from the chip 310. In the cap, a light sensing element or a thermal sensor may be contained to monitor the emitting status of the VCSEL.

FIG. 8B illustrates a configuration of another optical device. In an optical device 302 shown in FIG. 8B, instead of using the ball lens 360, a flat-plate glass 362 is fixed in an opening in a center portion of the cap 350. The center of the flat-plate glass 362 is positioned to match an approximate center of the chip 310. The distance between the chip 310 and the flat-plate glass 362 may be adjusted such that the opening diameter of the flat-plate glass 362 is equal to or greater than the divergence angle θ of the laser light from the chip 310.

Figure 9:
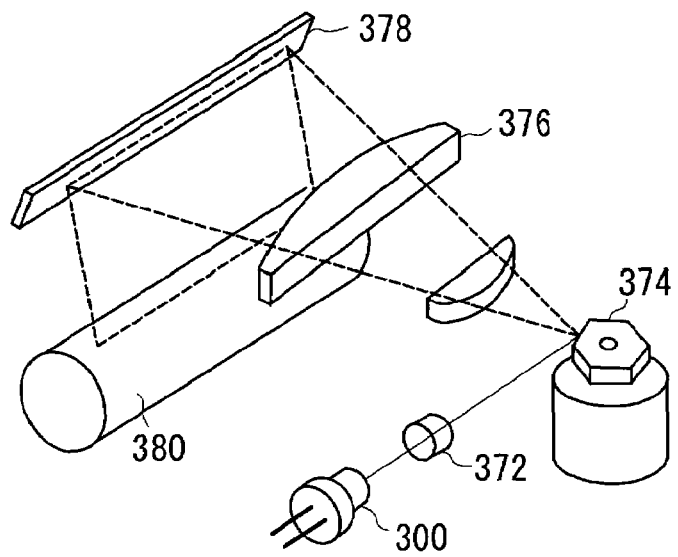
FIG. 9 illustrates an example of a configuration of an optical device in which a VCSEL is used.

FIG. 9 illustrates an example in which a VCSEL is used as a light source. A light irradiation device 370 may include the optical device 300 or 302 in which a VCSEL is mounted as shown in FIG. 8A or FIG. 8B, a collimator lens 372 that receives multi-beam laser light from the optical device 300 or 302, a polygon mirror 374 that rotates at a certain speed and reflects the light rays from the collimator lens 372 with a certain divergence angle, an fO lens 376 that receives laser light from the polygon mirror 374 and projects the laser light onto a line-shaped reflective mirror 378, the reflective mirror 378, and a light sensitive drum 380 that generates a latent image based on the reflected light from the reflective mirror 378. As described above, a VCSEL array can be used as a light source for an optical data processing device, for example, a copier or printer that includes an optical system that collects laser light from a VCSEL onto a light sensitive drum, and a mechanism that scans the collected laser light on the light sensitive drum.

Figure 10:
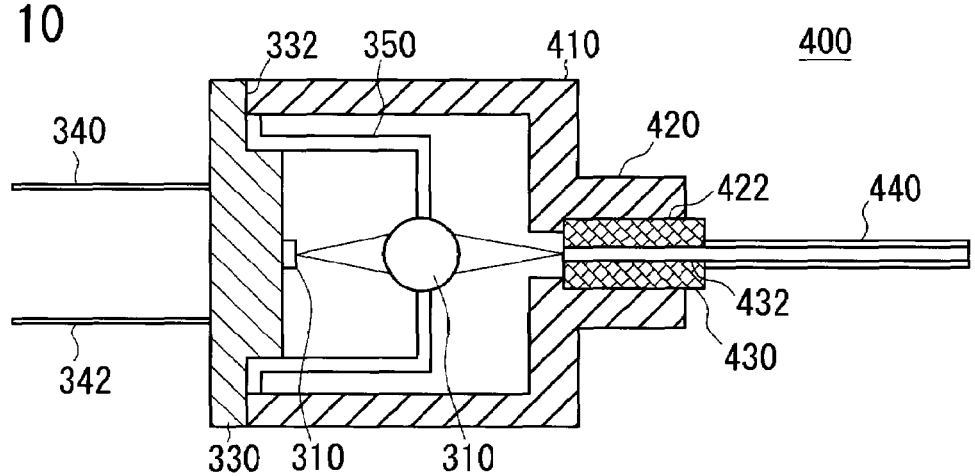
FIG. 10 is a schematic cross sectional view of a light source in which the optical component shown in FIG. 8A

FIG. 10 is a cross sectional view illustrating a configuration in which the optical device shown in FIG. 8A is applied to a light source. A light source 400 may include a cylindrical housing 410 fixed to the stem 330, a sleeve 420 formed integral with the housing 410 on an edge surface thereof, a ferrule 430 held in an opening 422 of the sleeve 420, and an optical fiber 440 held by the ferrule 430. In a flange 332 formed in a direction of the circumference of the stem 330, an edge portion of the housing 410 is fixed. The ferrule 430 is positioned exactly in the opening 422 of the sleeve 420, and the optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. Although the ball lens 360 is used in the example described above, other lens such as a biconvex lens or plane-convex lens may be used. In addition, the light source 400 may include a driving circuit for applying an electrical signal to the leads 340 and 342. Furthermore, the light source 400 may include a receiving function for receiving an optical signal via the optical fiber 440.

Figure 11:
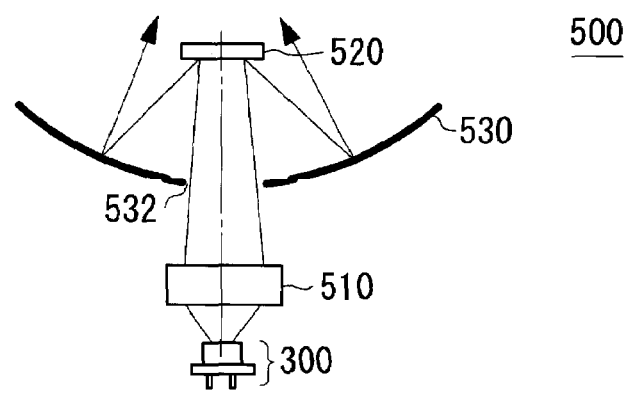
FIG. 11 illustrates a configuration in which the optical component shown in FIG. 8A

FIG. 11 illustrates a configuration in which the module shown in FIG. 8A is used in a free space optical communication system. A free space optical communication system 500 may include the optical device 300, a condensing lens 510, a diffusing plate 520, and a reflective mirror 530. The light concentrated by the condensing lens 510 passes through an opening 532 of the reflective mirror 530 and is reflected by the diffusing plate 520. The reflected light is reflected toward the reflective mirror 530. The reflective mirror 530 reflects the reflected light toward a predetermined direction to perform optical transmission.

Figure 12A:
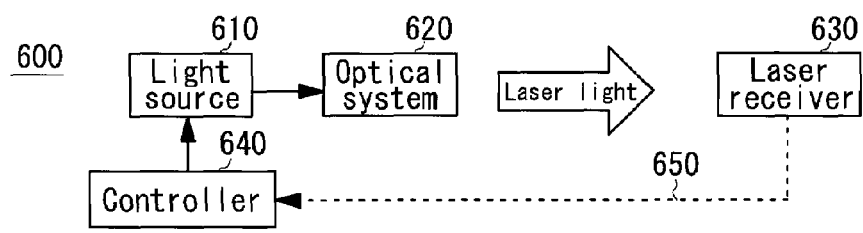
FIG. 12A is a block diagram to illustrate an optical transmission system.

FIG. 12A illustrates an example of a configuration of an optical transmission system in which a VCSEL is used as a light source. An optical transmission system 600 may include a light source 610 that contains the chip 310 in which a VCSEL is formed, an optical system 620, for example, for concentrating laser light that is emitted from the light source 610, a light receiver 630 for receiving laser light that is outputted from the optical system 620, and a controller 640 for controlling the driving of the light source 610. The controller 640 may provide a driving pulse signal for driving the VCSEL to the light source 610. The light emitted from the light source 610 is transmitted through the optical system 620 to the light receiver 630 by means of an optical fiber, or a reflective mirror for spatial transmission, or the like. The light receiver 630 may detect received light by a photo-detector, for example. The light receiver 630 is capable of controlling operations (for example, the start timing of optical transmission) of the controller 640, by a control signal 650.

Figure 12B:
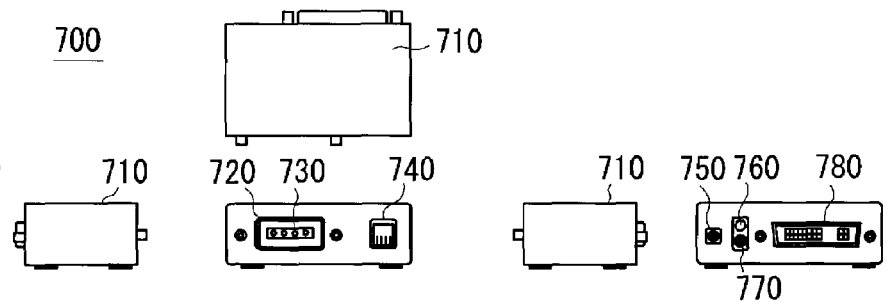
FIG. 12B illustrates an outer configuration of an optical transmission device.

FIG. 12B illustrates a configuration of an optical transmission device used for an optical transmission system. An optical transmission device 700 may include a case 710, an optical signal transmitting/receiving connector 720, a light emitting/light receiving element 730, an electrical signal cable connector 740, a power input 750, an LED 760 for indicating normal operation, an LED 770 for indicating an abnormality, and a DVI connector 780, and have a transmitting circuit board/receiving circuit board mounted inside.

Figure 13:
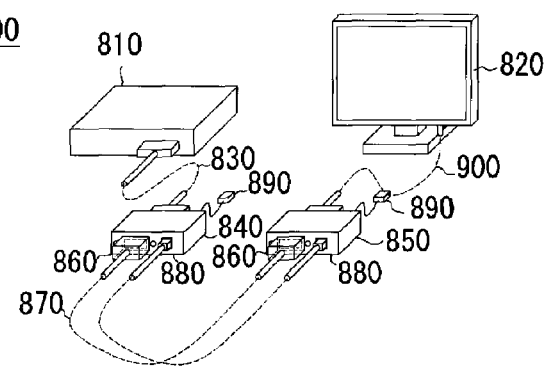
FIG. 13 illustrates a video transmission system that uses the optical transmission device of FIG. 12B.

FIG. 13 illustrates a video transmission system in which the optical transmission device 700 is used. A video transmission system 800 uses the optical transmission device shown in FIG. 12B for transmitting a video signal generated at a video signal generator 810 to an image display 820 such as a liquid crystal display. More specifically, the video transmission system 800 may include the video signal generator 810, the image display 820, an electrical cable 830 for DVI, a transmitting module 840, a receiving module 850, connectors 860 for a video signal transmission optical signal, an optical fiber 870, electrical cable connectors 880 for a control signal, power adapters 890, and an electrical cable 900 for DVI.

While exemplary embodiments of the present invention have been described in detail, the invention is not limited to these specific exemplary embodiments, and various modifications and changes can be made without departing from the inventive scope that is defined by the following claims.

A VCSEL according to an aspect of the invention can be used in fields such as optical data processing or optical high-speed data communication.

What is claimed is:

1. A Vertical-Cavity Surface-Emitting Laser diode (VCSEL) comprising;
   a substrate,
   a first distributed Bragg reflector of a first conductivity type, formed on the substrate and comprising at least one semiconductor layer to be oxidized,
   an active region having a column shaped structure on the first distributed Bragg reflector, and
   a second distributed Bragg reflector of a second conductivity type,
   at least one hole being formed in the first distributed Bragg reflector outside of a column shaped structure of the second distributed Bragg reflector, the hole being from a surface of the first distributed Bragg reflector and reaching the at least one semiconductor layer to be oxidized, and
   an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

2. The VCSEL according to claim 1, wherein the second distributed Bragg reflector comprises a current confining layer that narrows a current path.

3. The VCSEL according to claim 2, wherein the diameter of the conductive region surrounded by the oxidized region is equal to or smaller than the diameter of a conductive region in the current confining layer.

4. The VCSEL according to claim 1, wherein the diameter of the conductive region surrounded by the oxidized region is equal to or greater than 5 micrometers.

5. The VCSEL according to claim 1, wherein the at least one semiconductor layer to be oxidized comprises Al as a constituent element.

6. The VCSEL according to claim 2, wherein the current confining layer comprises Al as a constituent element, and comprises an insulating area that is selectively oxidized from a side surface of the column shaped structure.

7. The VCSEL according to claim 3, wherein the current confining layer comprises an insulating area formed by ion implantation.

8. The VCSEL according to claim 3, wherein the current confining layer comprises an area that narrows the current path by a buried semiconductor layer.

9. The VCSEL according to claim 1, wherein the first distributed Bragg reflector comprises a plurality of semiconductor layers to be oxidized, and the diameter of the conductive region surrounded by the oxidized region in each semiconductor layer to be oxidized varying inversely with distance from the active region.

10. The VCSEL according to claim 9, wherein each of the plurality of semiconductor layers to be oxidized has a different Al-composition or thickness.

11. The VCSEL according to claim 1, wherein the center portion of the conductive region surrounded by the oxidized region of the at least one semiconductor layer to be oxidized coincides with the central axis of the column shaped structure.

12. An optical device comprising;
a VCSEL;
an electrical connection terminal electrically connected to the VCSEL, and
an optical component that injects light emitted from the VCSEL,
the VCSEL including a substrate, a first distributed Bragg reflector of a first conductivity type, formed on the substrate and comprising at least one semiconductor layer to be oxidized, an active region having a column shaped structure on the first distributed Bragg reflector, and a second distributed Bragg reflector of a second conductivity type, at least one hole being formed in the first distributed Bragg reflector outside of a column shaped structure of the second distributed Bragg reflector, the hole being from a surface of the first distributed Bragg reflector and reaching the at least one semiconductor layer to be oxidized, and an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

13. A light irradiation device comprising;
a VCSEL;
an optical component comprising at least one of a lens or a mirror; and
an irradiation unit that irradiates light that is emitted from the VCSEL through the optical component,
the VCSEL including a substrate, a first distributed Bragg reflector of a first conductivity type, formed on the substrate and comprising at least one semiconductor layer to be oxidized, an active region having a column shaped structure on the first distributed Bragg reflector, and a second distributed Bragg reflector of a second conductivity type, at least one hole being formed in the first distributed Bragg reflector outside of a column shaped structure of the second distributed Bragg reflector, the hole being from a surface of the first distributed Bragg reflector and reaching the at least one semiconductor layer to be oxidized, and an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

14. A data processing device comprising;
an optical device; and
a sending unit that sends light that is emitted from the optical device,
the optical device including a VCSEL, an electrical connection terminal electrically connected to the VCSEL, and an optical component that injects light emitted from the VCSEL,
the VCSEL including a substrate, a first distributed Bragg reflector of a first conductivity type, formed on the substrate and comprising at least one semiconductor layer to be oxidized, an active region having a column shaped structure on the first distributed Bragg reflector, and a second distributed Bragg reflector of a second conductivity type, at least one hole being formed in the first distributed Bragg reflector outside of a column shaped structure of the second distributed Bragg reflector, the hole being from a surface of the first distributed Bragg reflector and reaching the at least one semiconductor layer to be oxidized, and an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

15. A light source comprising;
an optical device, and
a sending unit that sends light that is emitted from the optical device,
the optical device including a VCSEL, an electrical connection terminal electrically connected to the VCSEL, and an optical component that injects light emitted from the VCSEL,
the VCSEL including a substrate, a first distributed Bragg reflector of a first conductivity type, formed on the substrate and comprising at least one semiconductor layer to be oxidized, an active region having a column shaped structure on the first distributed Bragg reflector, and a second distributed Bragg reflector of a second conductivity type, at least one hole being formed in the first distributed Bragg reflector outside of a column shaped structure of the second distributed Bragg reflector, the hole being from a surface of the first distributed Bragg reflector and reaching the at least one semiconductor layer to be oxidized, and an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

16. A free space optical communication device comprising;

an optical device, and a transmission unit that spatially transmits light that is emitted from the the optical device, the optical device including a VCSEL, an electrical connection terminal electrically connected to the VCSEL, and an optical component that injects light emitted from the VCSEL, the VCSEL including a substrate, a first distributed Bragg reflector of a first conductivity type, formed on the substrate and comprising at least one semiconductor layer to be oxidized, an active region having a column shaped structure on the first distributed Bragg reflector, and a second distributed Bragg reflector of a second conductivity type, at least one hole being formed in the first distributed Bragg reflector outside of a column shaped structure of the second distributed Bragg reflector, the hole being from a surface of the first distributed Bragg reflector and reaching the at least one semiconductor layer to be oxidized, and an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

17. An optical transmission system comprising:

an optical device; and a transmission unit that transmits light that is emitted from the optical device, the optical device including a VCSEL, an electrical connection terminal electrically connected to the VCSEL, and an optical component that injects light emitted from the VCSEL, the VCSEL including a substrate, a first distributed Bragg reflector of a first conductivity type, formed on the substrate and comprising at least one semiconductor layer to be oxidized, an active region having a column shaped structure on the first distributed Bragg reflector, and a second distributed Bragg reflector of a second conductivity type, at least one hole being formed in the first distributed Bragg reflector outside of a column shaped structure of the second distributed Bragg reflector, the hole being from a surface of the first distributed Bragg reflector and reaching the at least one semiconductor layer to be oxidized, and an oxidized region formed in the semiconductor layer to be oxidized, the oxidized region being selectively oxidized from a side surface of the at least one hole, and a first current path and a second current path being formed in the first distributed Bragg reflector, the first current paths being formed by a conductive region surrounded by the oxidized region, and the second current path being formed by a conductive region not surrounded by the oxidized region.

\* \* \* \* \*